United States Patent
Hayakawa et al.

(10) Patent No.: US 10,173,393 B2
(45) Date of Patent: Jan. 8, 2019

(54) TRANSPARENT ELECTRODE-EQUIPPED SUBSTRATE AND METHOD FOR PRODUCING TRANSPARENT ELECTRODE-EQUIPPED SUBSTRATE

(71) Applicant: KANEKA CORPORATION, Osaka-shi, Osaka (JP)

(72) Inventors: Hironori Hayakawa, Otsu (JP); Shinya Omoto, Settsu (JP); Takashi Kuchiyama, Settsu (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 0 days.

(21) Appl. No.: 15/556,895

(22) PCT Filed: Mar. 18, 2016

(86) PCT No.: PCT/JP2016/058808
§ 371 (c)(1),
(2) Date: Sep. 8, 2017

(87) PCT Pub. No.: WO2016/152808
PCT Pub. Date: Sep. 29, 2016

(65) Prior Publication Data
US 2018/0194105 A1    Jul. 12, 2018

(30) Foreign Application Priority Data

Mar. 24, 2015 (JP) .................. 2015-061669

(51) Int. Cl.
*B32B 7/02* (2006.01)
*H01B 5/14* (2006.01)
(Continued)

(52) U.S. Cl.
CPC .............. *B32B 7/02* (2013.01); *C23C 14/08* (2013.01); *C23C 14/34* (2013.01); *C23C 14/58* (2013.01);
(Continued)

(58) Field of Classification Search
CPC ........... B32B 7/02; C23C 14/34; G06F 3/041; H01B 5/14
See application file for complete search history.

(56) References Cited

U.S. PATENT DOCUMENTS 4,550,221 A * 10/1985 Mabusth ............. G06F 3/03547
178/18.06
6,887,917 B2 * 5/2005 Yang ................... C08F 290/061
522/90
(Continued)

FOREIGN PATENT DOCUMENTS

CN        103443748 A     12/2013
JP        S61-290605 A    12/1986
(Continued)

OTHER PUBLICATIONS

International Preliminary Report on Patentability with Written Opinion of the International Searching Authority dated Oct. 5, 2017 corresponding to International Application No. PCT/JP2016/058808.
(Continued)

*Primary Examiner* — Timothy J Thompson
*Assistant Examiner* — Rhadames Alonzo Miller
(74) *Attorney, Agent, or Firm* — Hauptman Ham, LLP (57) ABSTRACT

A transparent electrode-equipped substrate includes a metal oxide transparent electrode layer on a transparent substrate. The average maximum curvature Ssc of the surface of the transparent electrode layer is preferably $5.4 \times 10^{-4}$ nm$^{-1}$ or less. For example, if the transparent electrode layer is
(Continued)

subjected to a surface treatment by low discharge-power sputtering after deposition, the Ssc of the transparent electrode layer can be reduced. This transparent electrode-equipped substrate excels in close adhesion between the transparent electrode layer and a lead-out wiring line disposed on the transparent electrode layer. The transparent electrode layer is obtained by, for example, performing a transparent electrode deposition step of through the application of a first discharge power and then performing a surface treatment step through the application of a second discharge power.

20 Claims, 5 Drawing Sheets (51) Int. Cl.
C23C 14/08 (2006.01)
C23C 14/34 (2006.01)
C23C 14/58 (2006.01)
G06F 3/041 (2006.01)
G06F 3/044 (2006.01)

(52) U.S. Cl.
CPC .............. *G06F 3/041* (2013.01); *G06F 3/044* (2013.01); *H01B 5/14* (2013.01)

(56) References Cited

U.S. PATENT DOCUMENTS

| | | | | |
|---|---|---|---|---|
| 7,868,957 | B2* | 1/2011 | Yamazaki | H01L 21/28008 349/43 |
| 2003/0213624 | A1* | 11/2003 | Cross | G06F 3/044 178/18.06 |
| 2004/0027339 | A1* | 2/2004 | Schulz | C03C 17/3417 345/173 |
| 2005/0069718 | A1* | 3/2005 | Voss-Kehl | B82Y 30/00 428/447 |
| 2006/0269737 | A1* | 11/2006 | Yasuda | H01B 1/22 428/323 |
| 2007/0063876 | A1* | 3/2007 | Wong | G06F 3/044 341/34 |
| 2007/0258035 | A1* | 11/2007 | Wang | G02F 1/136286 349/187 |
| 2008/0007534 | A1* | 1/2008 | Peng | G06F 3/044 345/173 |
| 2008/0054785 | A1* | 3/2008 | Hayashi | B29C 65/14 313/483 |
| 2008/0135282 | A1* | 6/2008 | Jonnalagadda | H05K 1/16 174/260 |
| 2008/0176042 | A1* | 7/2008 | Nashiki | G06F 3/044 428/172 |
| 2008/0218670 | A1* | 9/2008 | Kumai | G02F 1/133555 349/114 |
| 2008/0231606 | A1* | 9/2008 | Moon | G06F 3/0412 345/173 |
| 2008/0264699 | A1* | 10/2008 | Chang | G06F 3/044 178/18.01 |
| 2009/0046077 | A1* | 2/2009 | Tanaka | G06F 3/0412 345/174 |
| 2009/0051274 | A1* | 2/2009 | Hayashi | H01L 51/5246 313/504 |
| 2009/0096760 | A1* | 4/2009 | Ma | G02F 1/13338 345/174 |
| 2009/0115321 | A1* | 5/2009 | Hayashi | H01L 51/5246 313/504 |
| 2009/0160819 | A1* | 6/2009 | Sasaki | B32B 27/00 345/174 |
| 2010/0110023 | A1* | 5/2010 | Chien | G02B 5/201 345/173 |
| 2010/0225612 | A1* | 9/2010 | Ishizaki | G02F 1/13338 345/174 |
| 2010/0227426 | A1* | 9/2010 | Wang | G02F 1/136286 438/34 |
| 2011/0032209 | A1* | 2/2011 | Kim | G06F 3/044 345/174 |
| 2011/0080376 | A1* | 4/2011 | Kuo | G06F 3/0412 345/177 |
| 2011/0128257 | A1* | 6/2011 | Kim | G06F 3/041 345/175 |
| 2011/0262631 | A1* | 10/2011 | Lee | G06F 3/044 427/123 |
| 2011/0298756 | A1* | 12/2011 | Kim | G06F 3/0412 345/175 |
| 2012/0001169 | A1* | 1/2012 | Yamazaki | H01L 29/45 257/43 |
| 2012/0162104 | A1* | 6/2012 | Chang | G06F 3/0412 345/173 |
| 2012/0217516 | A1* | 8/2012 | Hatano | H01L 27/3246 257/88 |
| 2012/0249436 | A1* | 10/2012 | Choi | G06F 3/0412 345/173 |
| 2013/0100047 | A1* | 4/2013 | Liao | G06F 3/044 345/173 |
| 2014/0232951 | A1 | 8/2014 | Ueda et al. | |

FOREIGN PATENT DOCUMENTS

| | | |
|---|---|---|
| JP | S61-290607 A | 12/1986 |
| JP | H7-29884 A | 1/1995 |
| JP | H11-200033 A | 7/1999 |
| JP | 2006-219357 A | 8/2006 |
| JP | 2010-110897 A | 5/2010 |
| JP | 2013-228782 A | 11/2013 |

OTHER PUBLICATIONS

International Search Report dated May 24, 2016 for PCT/JP2016/058808.

* cited by examiner

Example 1
Ssc=3.1 × 10⁻⁴ nm⁻¹

Example 2
Ssc=4.9 × 10⁻⁴ nm⁻¹

Example 3
Ssc=4.5 × 10⁻⁴ nm⁻¹

Comparative Example 2
Ssc=5.5 × 10⁻⁴ nm⁻¹

TRANSPARENT ELECTRODE-EQUIPPED SUBSTRATE AND METHOD FOR PRODUCING TRANSPARENT ELECTRODE-EQUIPPED SUBSTRATE

CROSS REFERENCE TO RELATED APPLICATION

This application claims the priority of Japanese Patent Application No. 2015-061669, filed on Mar. 24, 2015 in the Japanese Patent Office. Further, this application is the National Phase application of International Application No. PCT/JP2016/058808 filed on Mar. 18, 2016, which is incorporated herein by reference in its entirety.

TECHNICAL FIELD

The present invention relates to a transparent electrode-equipped substrate and a method for producing a transparent electrode-equipped substrate.

BACKGROUND ART

A transparent electrode-equipped substrate in which a transparent electrode composed of a conductive oxide thin-film of indium tin composite oxide (ITO) or the like is formed on a transparent substrate such as a transparent film or glass is widely used in a device such as a display or a touch panel. In such a device, a transparent electrode is used in a component required to have transparency. A lead-out wiring line (extraction electrode) for electrically connecting a transparent electrode and an IC controller etc. is provided in a section that is not visible, such as a frame region in a display, and therefore is not required to have transparency, but required to have high conductivity. Thus, a metal layer, or an electroconductive paste containing a metal is used as a material for the lead-out wiring line.

As the frame area of a display, a touch panel and the like is narrowed, an area for connecting a lead-out wiring line and a transparent electrode is likely to be reduced. Thus, further improvement of adhesion between a transparent electrode and a lead-out wiring line is required. For solving the problem, Patent Document 1 discloses a technique in which an adhesion improving layer composed of an amorphous conductive oxide having a low crystallinity degree is provided on a transparent electrode composed of a crystalline conductive oxide, and a lead-out wiring line is provided on the adhesion improving layer.

PRIOR ART DOCUMENT

Patent Document

Patent Document 1: Japanese Patent Laid-open Publication No. 2013-228782

SUMMARY OF THE INVENTION

Problems to be Solved by the Invention

Generally, an amorphous conductive oxide is inferior in conductivity and transparency to a crystalline conductive oxide. Thus, when an adhesion improving layer composed of an amorphous conductive oxide is provided, conductivity and transparency of a substrate with a transparent electrode are deteriorated. Thus, in a substrate with a transparent electrode as in Patent Document 1, it is difficult to secure conductivity and transparency of the transparent electrode and improve adhesion of a lead-out wiring line simultaneously.

The present invention has been made for solving the problems described above, and a first objective of the present invention is to provide a substrate with a transparent electrode in which adhesion of a lead-out wiring line is improved, and to provide a method for producing the substrate with a transparent electrode. A second objective of the present invention is to provide a substrate with a transparent electrode in which conductivity and transparency are secured while adhesion is improved, and to provide a method for producing the substrate with a transparent electrode.

Means for Solving the Problems

A substrate with a transparent electrode includes a transparent electrode layer of a metal oxide on a transparent substrate such as a transparent film. The average maximum curvature Ssc of a surface of the transparent electrode layer is preferably $5.4 \times 10^{-4}$ nm$^{-1}$ or less.

The substrate with a transparent electrode may include an extraction electrode on the transparent electrode layer. As a layer under the transparent electrode layer, an underlying layer different from the transparent electrode layer may be provided.

Preferably, the transparent electrode is formed by a sputtering method. A transparent electrode layer having a small average maximum curvature Ssc is obtained by, for example, carrying out a step of applying a first discharge power $x_1$ to a sputtering target to a transparent electrode layer by sputtering at a deposition rate $y_1$ (transparent electrode deposition step), and then carrying out a step of applying a second discharge power $x_2$ to a sputtering target to surface-treat the transparent electrode layer at a deposition rate $y_2$ (surface treatment step). Preferably, the ratio $k_1 = y_1/x_1$ of the discharge power and the deposition rate in the transparent electrode deposition step and the ratio $k_2 = y_2/x_2$ of the discharge power and the deposition rate in the surface treatment step satisfy the relationship of $k_2 \leq 0.85 k_1$.

In other words, a method for producing a substrate with a transparent electrode by sputtering a metal oxide to form a transparent electrode layer on a transparent substrate includes a transparent electrode deposition step of depositing a transparent electrode while satisfying the following conditional expression (1), and a surface treatment step of performing a surface treatment while satisfying the following conditional expressions (2) and (3).

$$k_1 = y_1/x_1 \qquad \text{conditional expression (1)}$$

wherein $x_1$ is a discharge power supplied to a sputtering target in the transparent electrode deposition step; and
$y_1$ is a deposition rate with a sputtering target in the transparent electrode deposition step.

$$k_2 = y_2/x_2 \qquad \text{conditional expression (2)}$$

wherein $x_2$ is a discharge power supplied to a sputtering target in the surface treatment; and
$y_2$ is a deposition rate with a sputtering target in the surface treatment.

$$k_2/k_1 \leq 0.85 \qquad \text{conditional expression (3).}$$

The ratio $k_2/k_1$ is preferably 0.80 or less.

The concentration of oxygen to be used in the surface treatment is preferably higher than the concentration of oxygen to be used in formation of the transparent electrode layer. Preferably, the sputtering target to be used in the surface treatment has a composition identical to that of the sputtering target used in formation of the transparent electrode layer.

The method for producing a substrate with a transparent electrode may include an extraction electrode forming step of forming an extraction electrode on the surface-treated transparent electrode layer.

Effects of the Invention

A substrate with a transparent electrode according to the present invention is excellent in adhesion between a transparent electrode layer and a lead-out wiring line. Further, conductivity and transparency can be secured while adhesion is improved.

DESCRIPTION OF EMBODIMENTS

One embodiment of the present invention will be described below, but the present invention is not limited to the embodiment. The dimensional relation in each drawing is appropriately changed for the sake of clarification and simplification of the drawing, and an actual dimensional relation is not reflected in the drawing.

Figure 3:
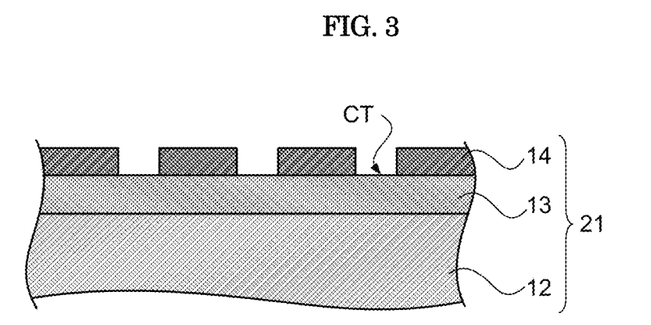
FIG. 3 is a sectional view of a substrate with a transparent electrode.

A substrate with a transparent electrode is widely used in a device such as a display or a touch panel. A substrate 21 with a transparent electrode includes at least a transparent substrate 12 and a transparent electrode (transparent electrode layer) 13 as shown in FIG. 3. A transparent electrode layer 13 having an extraction electrode 14 provided thereon is also classified as a substrate with a transparent electrode.

The transparent substrate 12 is a material serving as a base (basis) for the substrate 21 with a transparent electrode, and may be colorless and transparent in at least a visible light region. As the transparent substrate, a plate shape substrate such as a glass plate, a transparent film or the like is used. When a transparent film is used as the transparent substrate 12, the thickness thereof is not particularly limited, but is preferably 0.01 mm or more and 0.4 mm or less. When the thickness is within the above-mentioned range, the transparent film substrate 12, and the substrate 21 with a transparent electrode which is obtained using the transparent film substrate 12 have sufficient durability and moderate flexibility. When the thickness of the transparent film substrate 12 is within the above-mentioned range, the transparent electrode 13 etc. can be formed by a roll-to-roll method, and therefore productivity of the substrate 21 with a transparent electrode can be improved.

Examples of the material of the transparent film substrate include polyester resins such as polyethylene terephthalate (PET), polybutylene terephthalate (PBT) and polyethylene naphthalate; cycloolefin-based resins; polycarbonate resins; polyimide resins; and cellulose-based resins. Among them, polyethylene terephthalate or a cycloolefin-based resin is inexpensive and excellent in transparency, and is therefore preferably used as the transparent substrate 12.

Figure 4:
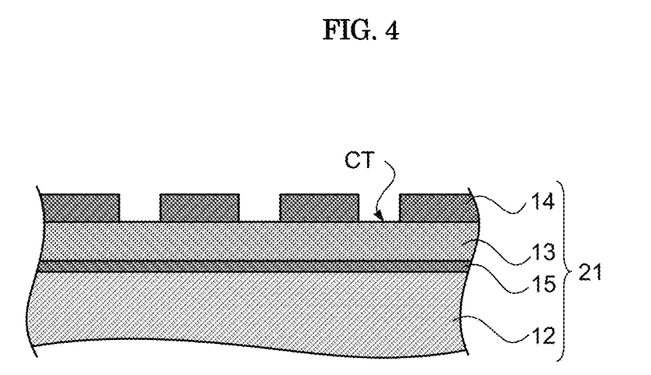
FIG. 4 is a sectional view of a substrate with a transparent electrode.

As shown in FIG. 4, various functional layers 15 (e.g., optical optimizing layer, anti-reflection layer, anti-glare layer, easily adhesive layer, stress buffer layer, hard coat layer, slippery layer, antistatic layer, crystallization acceleration layer, crystallization rate controlling layer, durability improvement layer or other layer) may be provided between the transparent substrate 12 and the transparent electrode layer 13. The functional layer 15 is preferably a layer (heterogeneous layer) composed of a material different from the materials of the transparent substrate 12 and the transparent electrode layer 13.

As the material of the functional layer, polymer materials such as acryl-based organic substances, urethane-based organic substances, silicone-based compounds, silane compounds and imide compounds; carbon materials; metallic materials such as magnesium, calcium, titanium, yttrium, zirconium, niobium, zinc, aluminum, indium, silicon and tin; oxides, nitrides and fluorides thereof and the like are used. A material obtained by appropriately combining these substances may be used as a material of the functional layer.

As the optical optimizing layer, an organic material layer or inorganic material layer different in refractive index from the transparent substrate 12 and the transparent electrode layer 13 is provided. For example, low-refractive-index layers of silicon oxide ($SiO_2$ or $SiO_x$) and the like, and high-refractive-index layers of $Nb_2O_5$ and the like can be used singly or as a stack of two or more thereof. On the transparent substrate 12, an organic-inorganic composite material layer different in refractive index from the transparent substrate may be provided as an optical optimizing layer which also has a function as a hard coat layer. As the easily adhesive layer, for example, an organic-inorganic composite material layer is used. As the stress buffer layer, for example, an inorganic material layer is used.

One functional layer (single layer) may have a single function, or may have a plurality of functions. For example, when a transparent dielectric layer as the optical optimizing layer is provided between the transparent substrate 12 and the transparent electrode layer 13, a function of improving adhesion between the transparent substrate 12 and the transparent electrode layer 13 can be imparted to the transparent dielectric layer. Thus, the transparent dielectric layer functions as the optical optimizing layer and the adhesion improvement layer. Examples of the material having those functions include $SiO_x$ (x=1.8 to 2.0).

The functional layer may be a single layer, or a multilayer. When the functional layer includes a plurality of layers, the functional layers may exhibit a single function or a plurality of functions, or some functional layers may be coupled with other functional layers to exhibit a single function or a plurality of functions.

The method for forming the functional layer is not particularly limited. As the method for forming the functional layer, for example, a dry process such as sputtering or aerosol deposition may be used, or a wet process in which inorganic particles are dispersed with an organic substance as a binder, or an inorganic film is formed by a sol-gel method is formed may be used.

The functional layer may be provided on a transparent electrode layer-non-formed surface of the transparent substrate 12, or on a surface of the transparent electrode layer 13. A surface of the transparent substrate 12 may be subjected to a treatment for improving adhesive property with the functional layer 15 or the transparent electrode layer 13. Examples of the treatment for improving adhesive property include treatments for imparting electric polarity to a surface of the transparent substrate 12. Specific examples thereof include corona discharge and plasma treatments.

The transparent electrode 13 will now be described. The transparent electrode 13 is formed one or both of surfaces of the transparent substrate 12. The transparent electrode may be either a film shape or a layer shape, and thus can be referred to as a "transparent electrode layer". The transparent electrode layer 13 may have a single-layer structure or a multilayer structure.

The material of the transparent electrode 13 is not particularly limited as long as it can attain both transparency and conductivity. Examples of the material of the transparent electrode 13 include materials mainly composed of metal oxides such as indium oxide, zinc oxide and tin oxide. From the viewpoint of stability of quality, a metal oxide mainly composed of indium oxide such as indium tin oxide (ITO) is preferably used as a material of the transparent electrode 13.

When a deposition surface (surface on a side opposite to the transparent substrate 12) of the transparent electrode layer 13 has a small average maximum curvature Ssc, adhesion with the extraction electrode 14 provided on the transparent electrode layer 13 tends to be improved. The average maximum curvature Ssc is an arithmetic average of the curvatures of the highest points (peaks) of projections existing in an observation surface, and is calculated from the following expression.

$$Ssc = \frac{-1}{2n} \sum_{i=1}^{n} \left\{ \frac{\delta^2 Z(X_i, Y_i)}{\delta X^2} + \frac{\delta^2 Z(X_i, Y_i)}{\delta Y^2} \right\}$$

In the above expression, n represents the number of protrusions in the observation, and Z represents the height of a protrusion (projection). X and Y represent an X coordinate and a Y coordinate in the observation surface, and (X,Y) represents a position of a protrusion in the observation surface. $(X_i, Y_i)$ represents coordinates of the i-th protrusion.

Figure 1:
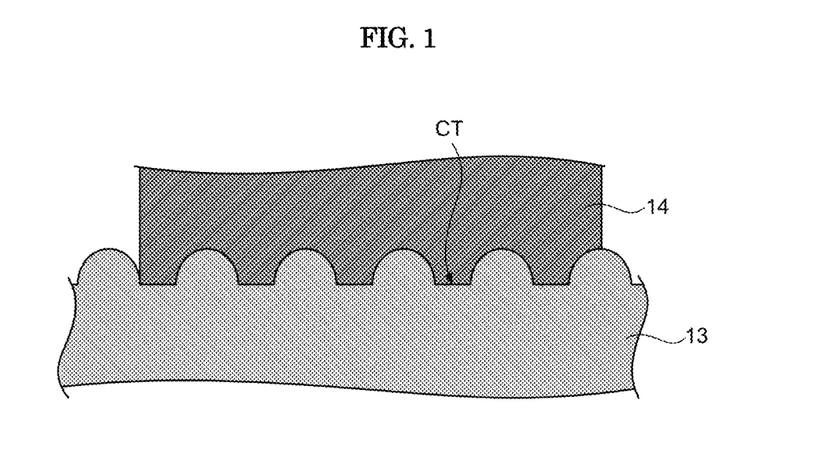
FIG. 1 is a conceptual view showing a state in which a lead-out wiring line is provided on a transparent electrode layer with a surface having a small average maximum curvature Ssc.
Figure 2:
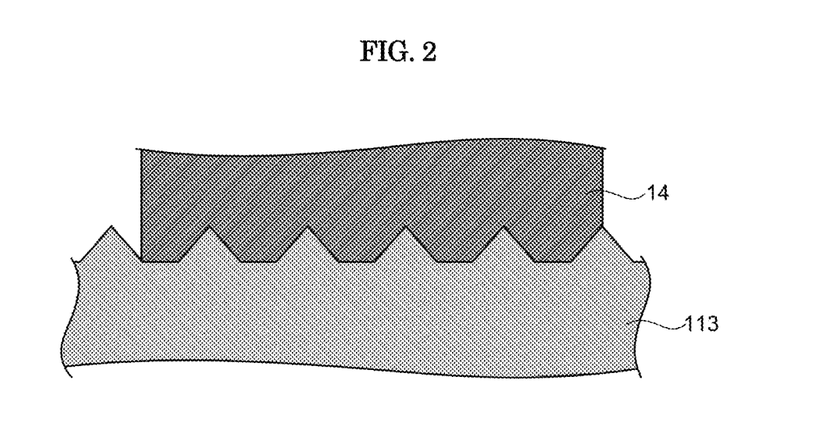
FIG. 2 is a conceptual view showing a state in which a lead-out wiring line is provided on a transparent electrode layer with a surface having a large average maximum curvature Ssc.

FIG. 1 is a conceptual view where a surface of the transparent electrode layer 13 in the substrate 21 with a transparent electrode has a small average maximum curvature Ssc (e.g., $5.4 \times 10^{-4}$ nm$^{-1}$ or less). FIG. 2 is a conceptual view where a surface of a transparent electrode layer 113 has a small average maximum curvature Ssc (e.g., more than $5.4 \times 10^{-4}$ nm$^{-1}$). FIGS. 1 and 2 are views for easily understanding a surface CT subjected to a surface treatment (adhesion-enhancing processing) as described later. A larger average maximum curvature Ssc corresponds to sharper peaks of the projections, and a smaller average maximum curvature Ssc corresponds to more roundish peaks of the projections.

The average maximum curvature Ssc is a parameter allowing for only the tips (peaks) of projections, and is therefore essentially different from a parameter showing the roughness of the overall surface like an arithmetic average height Sa. Therefore, transparent electrode layers may be different in value of the average maximum curvature Ssc although they are comparable in arithmetic average height Sa. In this connection, the transparent electrode layer 13 in FIG. 1 and the transparent electrode layer 113 in FIG. 2 are comparable in height of projections, and different only in sharpness of peaks, and therefore both the layers are comparable in arithmetic average height Sa, but different in average maximum curvature Ssc.

The average maximum curvature Ssc of a surface of the transparent electrode layer 13 is preferably $5.4 \times 10^{-4}$ nm$^{-1}$ or less, more preferably $5.0 \times 10^{-4}$ nm$^{-1}$ or less, further preferably $4.5 \times 10^{-4}$ nm$^{-1}$ or less, especially preferably $3.0 \times 10^{-4}$ nm$^{-1}$ or less. The lower limit of the average maximum curvature Ssc is not particularly limited, but is preferably $2.5 \times 10^{-4}$ nm$^{-1}$. The average maximum curvature Ssc is preferably $2.5 \times 10^{-4}$ nm$^{-1}$ or more and $5.4 \times 10^{-4}$ nm$^{-1}$ or less, more preferably $2.5 \times 10^{-4}$ nm$^{-1}$ or more and $5.0 \times 10^{-4}$ nm$^{-1}$ or less, further preferably $2.5 \times 10^{-4}$ nm$^{-1}$ or more and $4.5 \times 10^{-4}$ nm$^{-1}$ or less, especially preferably $2.5 \times 10^{-4}$ nm$^{-1}$ or more and $3.0 \times 10^{-4}$ nm$^{-1}$ or less.

When the peaks of projections on a surface of the transparent electrode layer 113 are sharp as shown in FIG. 2, stress concentration mainly on the peals of the projections easily occurs at the interface between the transparent electrode and the extraction electrode. Locally concentrated stress may act as a motive force for collapse of the interface, resulting in deterioration of adhesion between the transparent electrode and the extraction electrode. It is considered that when conversely, the peaks of projections on a surface of the transparent electrode layer 13 are not sharp (peaks are blunt and roundish) as shown in FIG. 1, stress concentration hardly occurs at the interface between the transparent electrode and the extraction electrode, leading to improvement of adhesion between the transparent electrode and the extraction electrode.

The transparent electrode layer 13 is formed by, for example, a sputtering method. When the transparent electrode layer 13 is formed by a sputtering method, the layer is formed (transparent electrode deposition step) at a power within a discharge power region (proportion range) where the discharge power is proportional to the deposition rate, and subsequently, a treatment (surface treatment step) within a power region (deviation range) where the discharge power is not proportional to the deposition rate is performed at a power lower than that in the proportion range to obtain a transparent electrode layer having a small average maximum curvature Ssc.

Figure 6:
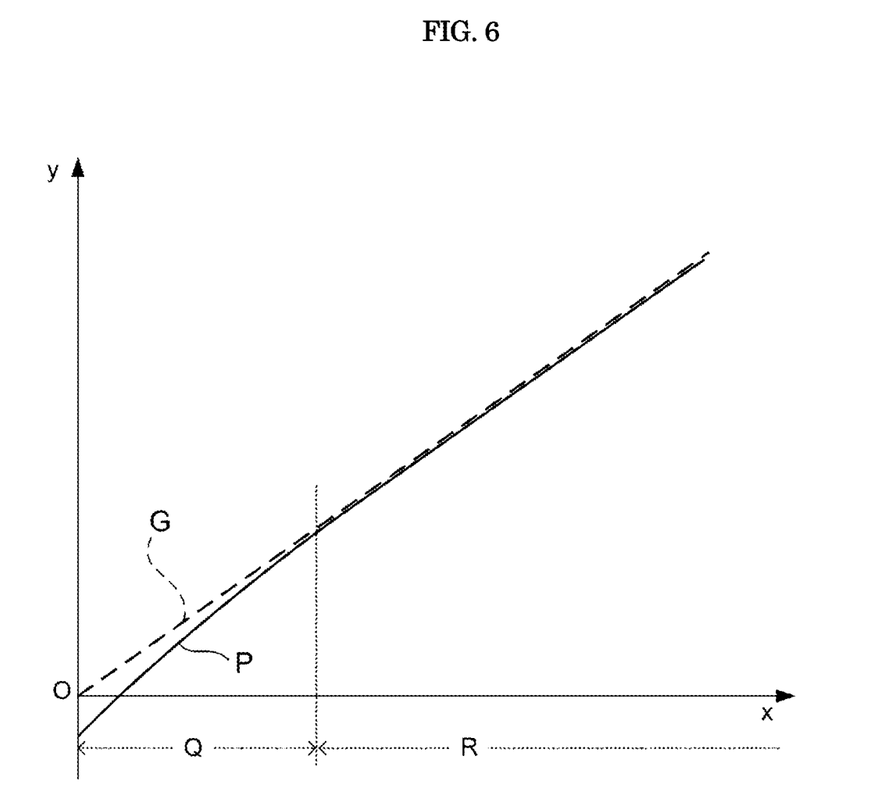
FIG. 6 is a graph showing a relationship between the discharge power (x) and the deposition rate (y) in sputtering.

In general sputtering deposition, the deposition rate y is proportional to the discharge power x, and the relationship of y=kx (k is a constant) is satisfied as shown by a broken line G in FIG. 6. In a range Q where the discharge power is extremely small, the magnitude of the plasma etching rate is not negligible with respect to the deposition rate, and therefore as shown by a solid line P, the deposition rate is not proportional to the discharge power. In other words, when sputtering is performed in the power range Q (deviation range) where the deposition rate y is not proportional to the discharge power x thereby the relationship of y<kx being satisfied, a high etching effect is obtained. By taking advantage of the etching effect, the average maximum curvature Ssc of the transparent electrode layer 13 can be reduced to improve adhesion with the extraction electrode 14. Thus, by performing a sputtering treatment at a power in the deviation range after forming the transparent electrode layer by sputtering at a power in the proportion range, the transparent electrode layer is surface-treated, so that the transparent electrode layer 13 having excellent adhesion with the extraction electrode can be formed.

Whether or not the discharge power is proportional to the deposition rate, i.e., whether the power is in the proportion range or in the deviation range can be determined from comparison of the deposition rates in formation of the layer at a specific discharge power and at a discharge power lower by 10% than the specific discharge power. A method for determining whether or not the deposition rate is proportional to the discharge power will be described with reference to FIG. 5.

Figure 5:
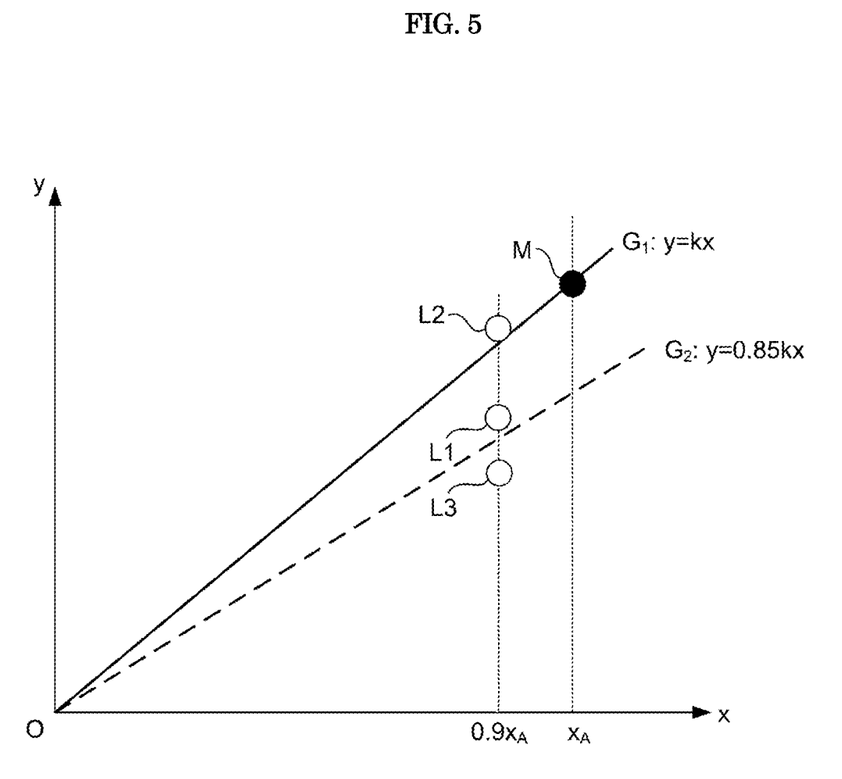
FIG. 5 is a view for explaining a method for determining whether or not a discharge power (x) is proportional to a deposition rate (y).

As shown in FIG. 5, in the plane of a graph where the abscissa (x axis) represents a discharge power and the ordinate (y axis) represents a deposition rate, the values of the sputtering discharge power $x_A$ and the deposition rate at the time of forming the transparent electrode or performing a surface treatment are plotted as a point M, and a straight line $G_1$ passing through the point M and the origin O is drawn. This straight line is represented by y=kx, and the coordinates of the point M are represented by ($x_A$, $kx_A$). The deposition rate y is calculated as the amount of increase in thickness per unit time from the thickness of the transparent electrode sample.

Next, an imaginary line $G_2$ indicating a deposition rate smaller by 15% than the deposition rate in the line $G_1$ is drawn. The line $G_2$ is represented by y=0.85kx. Point at which the deposition rate in formation of the layer at a discharge power $0.9x_A$, i.e., a discharge power smaller by 10% than the discharge power at the point M, is plotted on a graph plane. When the plotted point lies above the straight line $G_2$ like points L1 and L2, it is determined that the discharge power x is proportional to the deposition rate y (the discharge power $x_A$ is within the proportion range) for the specific discharge power $x_A$. When the plotted point lies below the straight line G2 like the point L3, or lies on the straight line G2, it is determined that the discharge power x is not proportional to the deposition rate y.

In the deviation range Q where the discharge power and the deposition rate are not proportional to each other, the deposition rate y is not more than 0.85 times of the deposition rate in the proportion range, and therefore the relationship of y≤0.85kx is satisfied. Accordingly, when the layer is formed by sputtering at a first discharge power $x_1$ within the proportion range, and a surface treatment is then performed at a second discharge power $x_2$ within the deviation range, the relationship of $(y_2/x_2) \leq 0.85(y_1/x_1)$ is satisfied where $y_1$ is a deposition rate at the first discharge power $x_1$, and $y_2$ is a deposition rate at the second discharge power $x_2$. Thus, by performing a surface treatment at the discharge power $x_2$ in which the ratio $k_1=y_1/x_1$ of the discharge power and the deposition rate at the first discharge power and the ratio $k_2=y_2/x_2$ of the discharge power and the deposition rate at the second discharge power satisfy the relationship of $k_2/k_1 \leq 0.85$, a transparent electrode layer having a small average maximum curvature Ssc and excellent adhesion with the extraction electrode is obtained.

Sputtering deposition conditions at the first discharge power $x_1$ within the proportion range are not particularly limited as long as they are general deposition conditions. Generally, by discharging electricity while introducing an inert gas such as argon and an oxidizing gas such as oxygen into a chamber, a conductive oxide is deposited by sputtering to form a transparent electrode layer.

In a precise sense, it is necessary to determine the ratio k of the discharge power x and the deposition rate y for each layer (or each sputtering target) when the transparent electrode layer includes a plurality of layers, or the transparent electrode layer is formed using a plurality of sputtering targets. For example, when a power is applied to each of a first target, a second target and a third target to form a transparent electrode layer with three divided parts in the thickness direction, ratios $k_{11}$, $k_{12}$ and $k_{13}$ of the discharge power and the deposition rate are determined, respectively, from a discharge power $x_{11}$ and a deposition rate $y_{11}$ for the first target, a discharge power $x_{12}$ and a deposition rate $y_{12}$ for the second target and a discharge power $x_{13}$ and a deposition rate $y_{13}$ for the third target. The discharge powers $x_{11}$, $x_{12}$ and $x_{13}$ for these targets are each within the proportion range, and therefore the ratios $k_{11}$, $k_{12}$ and $k_{13}$ are substantially equal to one another. Thus, the ratio $k_{13}$ of the discharge power and the deposition rate that are within the proportion range in deposition of the outermost surface (deposition by discharge to the third target) can be considered as the ratio $k_1$ of the discharge power and the deposition rate in sputtering deposition at a power density in the proportion range.

A transparent electrode layer formed by sputtering at a discharge power within the proportion range has a large average maximum curvature Ssc at a deposition surface, and the value thereof is generally $5.5 \times 10^{-4}$ $nm^{-1}$ or more. By subjecting the deposition surface to a surface treatment (adhesion-enhancing processing) at the second discharge power $x_2$ smaller than the discharge power $x_1$ during formation of the transparent electrode, the average maximum curvature Ssc can be reduced. As described above, when sputtering is performed at the discharge power $x_2$ in the deviation range where the discharge power is not proportional to the deposition rate, the influence of plasma etching increases, so that the surface shape is changed, leading to a decrease in average maximum curvature Ssc.

In the deviation range, the influence of plasma etching during sputtering increases as the discharge power decreases. Therefore, the ratio $k_2=y_2/x_2$ of the discharge power $x_2$ and the ratio $y_2$ of the deposition rate tends to decrease as the discharge power decreases. When the plasma etching rate is higher than the sputtering deposition rate, the thickness is decreased by the surface treatment, so that the deposition rate $y_2$ takes a negative value, and therefore the ratio $k_2$ takes a negative value.

The average maximum curvature Ssc of the transparent electrode layer 13 after the surface treatment tends to decrease as the ratio $k_2$ becomes smaller in comparison with the ratio $k_1$, wherein $k_2$ is a ratio between discharge power $x_2$ and the deposition rate $y_2$ during the surface treatment of the transparent electrode layer at the second discharge power in the deviation range, and $k_1$ is a ratio between the discharge power $x_1$ and the deposition rate $y_1$ during formation of the transparent electrode layer by sputtering at the first discharge power in the proportion range. The ratio $k_2/k_1$ of $k_1$ and $k_2$ is preferably 0.85 or less as described above. The ratio $k_2/k_1$ is more preferably 0.8 or less, further preferably 0.75 or less. When the ratio $k_2$ is excessively small, the transparent electrode layer tends to be excessively plasma-etched during the surface treatment, leading to an increase in damage to the transparent electrode layer. Thus, the ratio $k_2/k_1$ is preferably −2 or more, more preferably −1.5 or more, further preferably −1 or more.

For enhancing the effect of surface treatment by sputtering at a low discharge power, a difference $Ssc_0 - Ssc_1$ is preferably $5 \times 10^{-5}$ $nm^{-1}$ or more, more preferably $8 \times 10^{-5}$ $nm^{-1}$ more, further preferably $1 \times 10^{-4}$ $nm^{-1}$ or more, wherein $Ssc_0$ is the average maximum curvature of the surface of the transparent electrode layer before the surface treatment and $Ssc_1$ is the average maximum curvature of the surface of the transparent electrode layer after the surface treatment. The difference $Ssc_0$–$Ssc_1$ corresponds to a decrease amount in average maximum curvature Ssc by the surface treatment. As described above, when the discharge power during the surface treatment is decreased to reduce the ratio $k_2/k_1$ decreases, the difference $Ssc_0$–$Ssc_1$ tends to increase. When the surface treatment time is increased, the difference $Ssc_0$–$Ssc_1$ tends to increase. When a change in average maximum curvature Ssc by the surface treatment is excessively large, damage to the transparent electrode layer tends to increase. Thus, the difference $Ssc_0$–$Ssc_1$ is preferably $3 \times 10^{-4}$ nm$^{-1}$ or less, more preferably $2.5 \times 10^{-4}$ nm$^{-1}$ or less.

For suppressing damage to the transparent electrode 13, the discharge voltage during the surface treatment is preferably small. The discharge voltage during the surface treatment is preferably 400 V or less, more preferably 350 V or less.

Preferably, the surface treatment at the second discharge power is performed such that the surface shape is controlled while maintaining transparency and conductivity of the transparent electrode. In the surface treatment, sputtering deposition from a target proceeds in parallel to plasma etching, and therefore the surface of the transparent electrode layer after the surface treatment also depends on the composition of the target. For maintaining transparency and conductivity of the transparent electrode layer, it is preferable to perform a surface treatment using a target having the same composition as the composition during sputtering deposition. For example, when sputtering deposition is performed using an ITO target, it is preferable to use an ITO target as a target for the surface treatment. Preferably, the sputtering target to be used in the surface treatment has a composition identical to that of the sputtering target used in formation of the transparent electrode layer. For example, when an ITO target is used, the difference in tin content between the target during deposition and the target during the surface treatment is preferably within a range of ±1%. When sputtering is performed in a batch manner, the same target may be used for formation of the transparent electrode layer and for the surface treatment of the transparent electrode layer so that the targets during sputtering deposition and during the surface treatment have similar compositions.

It is preferable that an atmospheric gas during the surface treatment has a large amount of oxygen so that plasma etching easily occurs by sputtering at a low discharge power. The oxygen partial pressure in a chamber during the surface treatment is preferably larger than the oxygen partial pressure in the chamber during deposition. When the oxygen partial pressure is excessively large, damage to the transparent electrode layer may increase. Thus, the oxygen partial pressure during the surface treatment is preferably $5 \times 10^{-4}$ Pa or more and $5 \times 10^{-2}$ Pa or less, more preferably $1 \times 10^{-3}$ Pa or more and $1 \times 10^{-2}$ Pa or less.

The substrate with a transparent electrode according to the present invention can be used as a transparent electrode for a display, a position detection electrode in a touch panel, and the like. When the substrate with a transparent electrode is used in these devices, the extraction electrode 14 is formed (extraction electrode forming step) on the transparent electrode layer 13 after the surface treatment. The extraction electrode 14 is a lead-out wiring line for electrically connecting the transparent electrode 13 to an IC controller etc. Since the extraction electrode 14 is not required to have transparency, and importance is placed on its conductivity, a metal is used as a material of the extraction electrode 14. An electroconductive paste, for example, is used for formation of a metallic extraction electrode. A metal may be deposited in the form of a layer by a dry process such as a sputtering method, followed by patterning the metal layer by etching to form an extraction electrode.

The transparent electrode layer 13 after the surface treatment in the substrate 21 with a transparent electrode is generally an amorphous film. When the transparent electrode layer is heated under an oxygen-containing atmosphere, the transparent electrode layer 13 is crystallized. The transparent electrode layer may be crystallized either before or after formation of the extraction electrode 14. Crystallization of the transparent electrode layer 13 tends to improve conductivity and transparency. Crystallization of the transparent electrode layer tends to improve adhesion between the transparent electrode 13 and the extraction electrode 14.

According to the present invention, a transparent electrode layer is formed, and then surface-treated at a low discharge power to obtain a substrate with a transparent electrode which includes a transparent electrode layer having a small average maximum curvature Ssc and excellent adhesion with an extraction electrode as described above. By crystallizing the transparent electrode layer, conductivity and transparency are improved. Even when the transparent electrode layer is crystallized, adhesion between the transparent electrode and the extraction electrode is high. Thus, there can be provided a substrate with a transparent electrode in which a transparent electrode has conductivity and transparency, and high adhesion with a lead-out wiring line is attained simultaneously.

EXAMPLES

Hereinafter, the present invention will be described more in detail by showing examples, but the present invention is not limited to these examples.

Methods for measurement of the thickness, the surface roughness (Ssc and Sa) and adhesion (peel ratio) with an extraction electrode are as follows.

[Measurement of Thickness]

The thickness of the transparent electrode layer was measured by a calibration curve method using a scanning X-ray fluorescence spectrometer ZSX Primus III+ manufactured by Rigaku Corporation.

[Measurement of Surface Roughness]

The surface roughness of the transparent electrode layer was measured using a scanning probe microscope system NanoNaviReal (scanner model number: FS20N) manufactured by SII Nanotechnology Inc. Specifically, a measurement was made over a range of 1 μm×1 μm in the DMF mode with a resolution of 256×256 using a cantilever SI-DF40 (manufactured by SII Nanotechnology Inc., spring constant: 42 N/m). An image obtained in the measurement was subjected to inclination correction, and then to analysis by a roughness analysis program SPIP to calculate an average maximum curvature Ssc and an arithmetic average height Sa.

Detailed measurement conditions are as follows.
Scanning frequency: 1 Hz
I gain: 0.2
P gain: 0.05
A gain: 0

[Evaluation of Adhesion with Lead-Out Wiring Line (Measurement of Peel Ratio)]

A transparent film substrate with a transparent electrode layer stacked thereon was annealed at 140° C. for 90 minutes, an electrode pattern (extraction electrode) resembling a lead-out wiring line was formed on the transparent electrode layer, and adhesion was evaluated.

A silver paste was applied by screen printing in a pattern having a line width of 1 mm, a thickness of 7 μm and a line interval of 1 mm, and then baked at 140° C. for 60 minutes to cure the silver paste, so that an extraction electrode was formed. The sample was stored in an environment at a temperature of 60° C. and a humidity of 90% for 240 hours, and then taken out to conduct a peeling test described below.

The sample was cross-cut to 100 squares, and an image of the sample was then captured by a scanner, and a tape peeling test was conducted. After the peeling test was conducted, an image of the sample was captured by the scanner again, and the electrode area after the peeling test was divided by the electrode area before the peeling test to calculate a ratio of the area of a peeled section (peel ratio). For calculation of the electrode area, only a section surrounded by the cut line was used, and a section outside the outer periphery of the 100 squares was not used.

Example 1

As a transparent substrate, a transparent film substrate was used in which a hard coat layer having a refractive index adjustment function was formed on both surfaces of a PET film having a thickness of 50 μm and a glass transition temperature of 80° C.

The transparent film substrate was introduced into a roll-to-roll-type sputtering deposition apparatus, and an ITO target having a tin oxide content of 7.0% by mass was set in each of cathodes in five chambers. Thereafter, the transparent film substrate was conveyed in the deposition apparatus and evacuation was performed such that the water partial pressure in the chambers reached $1 \times 10^{-4}$ Pa. The vacuum state was maintained and heating was performed with the chamber internal temperature set to 90° C. so that the transparent film substrate was degassed.

Thereafter, an ITO transparent electrode layer was formed on the transparent film substrate with four chambers as chambers for deposition. An ITO layer as a crystallization rate controlling layer was formed in first chamber, and an ITO layer as a principal electrode layer was formed in second to fourth chambers.

Sputtering deposition was performed for 10 seconds to form the crystallization rate controlling layer, at a discharge power of 6.8 kW using a DC power supply under the condition of a substrate temperature of 0° C. and a chamber internal pressure of 0.4 Pa while introducing argon and oxygen at a ratio of 100:15 into a chamber. The crystallization rate controlling layer had a thickness of 2.4 nm. The deposition rate of the crystallization rate controlling layer was 0.24 nm/sec, and the deposition rate constant k expressed by deposition rate/discharge power was 0.035 nm/kW·sec.

The principal electrode layer was formed on the crystallization rate controlling layer by performing sputtering deposition for total 30 seconds, with a deposition time of 10 seconds in each chamber, at a discharge power of 18.5 kW using a DC power supply under the condition of a substrate temperature of 0° C. and a chamber internal pressure of 0.4 Pa while introducing argon and oxygen at a ratio of 100:5 into a chamber. The principal electrode layer had a thickness of 19.7 nm. The deposition rate of the principal electrode layer was 0.66 nm/sec, and the deposition rate constant k expressed by deposition rate/discharge power was 0.035 nm/kW·sec.

As described above, each of the deposition rate of the crystallization rate controlling layer and the deposition rate constant $k_1$ of the principal electrode layer was 0.035 nm/kW·sec. The discharge power and the deposition rate were proportional to each other when the discharge power was in a range of 6.8 kW to 18.5 kW.

After formation of the transparent electrode layer, the transparent electrode layer was surface-treated in the fifth chamber. The treatment was performed for 10 seconds at a discharge power of 0.5 kW using a DC power supply under the condition of a substrate temperature of 0° C. and a chamber internal pressure of 0.4 Pa while introducing argon and oxygen at a ratio of 100:15 into a chamber. The thickness of the transparent electrode layer after the surface treatment was lower by 0.16 nm than the thickness before the treatment. The deposition rate in the surface treatment was −0.016 nm/sec, and the surface treatment reduced the thickness. The deposition rate constant $k_2$ expressed by deposition rate/discharge power was −0.032 nm/kW sec. The ratio of $k_2/k_1$ of the deposition rate constant $k_1$ during formation of the transparent electrode and the deposition rate constant $k_2$ during the surface treatment was −0.89.

The resulting substrate with a transparent electrode was annealed at 140° C. for 90 minutes in a hot-air drying oven. After the annealing, the sheet resistance of the transparent electrode layer was 132 Ω/sq, and the contact angle with water was 60.1°. The surface of the transparent electrode layer after the annealing had an average maximum curvature Ssc of $3.1 \times 10^{-4}$ nm$^{-1}$ and an arithmetic average height Sa of 0.38 nm. Adhesion with the lead-out wiring line was evaluated, and the result showed that the peel ratio was 3.4%.

Examples 2 to 4 and Comparative Example 1

Except that the discharge power during the surface treatment was changed as shown in Table 1, the same procedure as in Example 1 was carried out to prepare a substrate with a transparent electrode, and evaluation was conducted.

Comparative Example 2

Except that a surface treatment was not performed after a crystallization rate controlling layer and a transparent electrode layer were formed, the same procedure as in Example 1 was carried out to prepare a substrate with a transparent electrode. The resulting substrate with a transparent electrode was evaluated in the same manner as in Example 1.

Comparative Example 3

An ITO target having a tin oxide content of 7.0% by mass was set in each of cathodes in six chambers, and a crystallization rate controlling layer was formed in the first chamber under the same condition as in Example 1. Thereafter, sputtering deposition was performed for total 50 seconds in five chambers, i.e., second to sixth chambers, to form a principal electrode layer having a thickness of 19.7 nm. The conditions were identical to those for formation of the principal electrode layer in Example 1 except that the discharge power was changed to 11.1 kW. Surface treatment was not performed after the sputtering deposition. The resulting substrate with a transparent electrode was evaluated in the same manner as in Example 1.

Comparative Example 4

An ITO target having a tin oxide content of 7.0% by mass was set in each of cathodes in three chambers. A crystallization rate controlling layer was not formed. In all of the three chambers, sputtering deposition was performed under a condition identical to those for formation of the principal electrode layer in Example 1. A transparent electrode layer having a thickness of 23.0 nm was formed with the deposition time increased by making the transparent film substrate conveyance speed smaller than that in Example 1. Surface treatment was not performed after the sputtering deposition. The resulting substrate with a transparent electrode was evaluated in the same manner as in Example 1.

Figure 7:
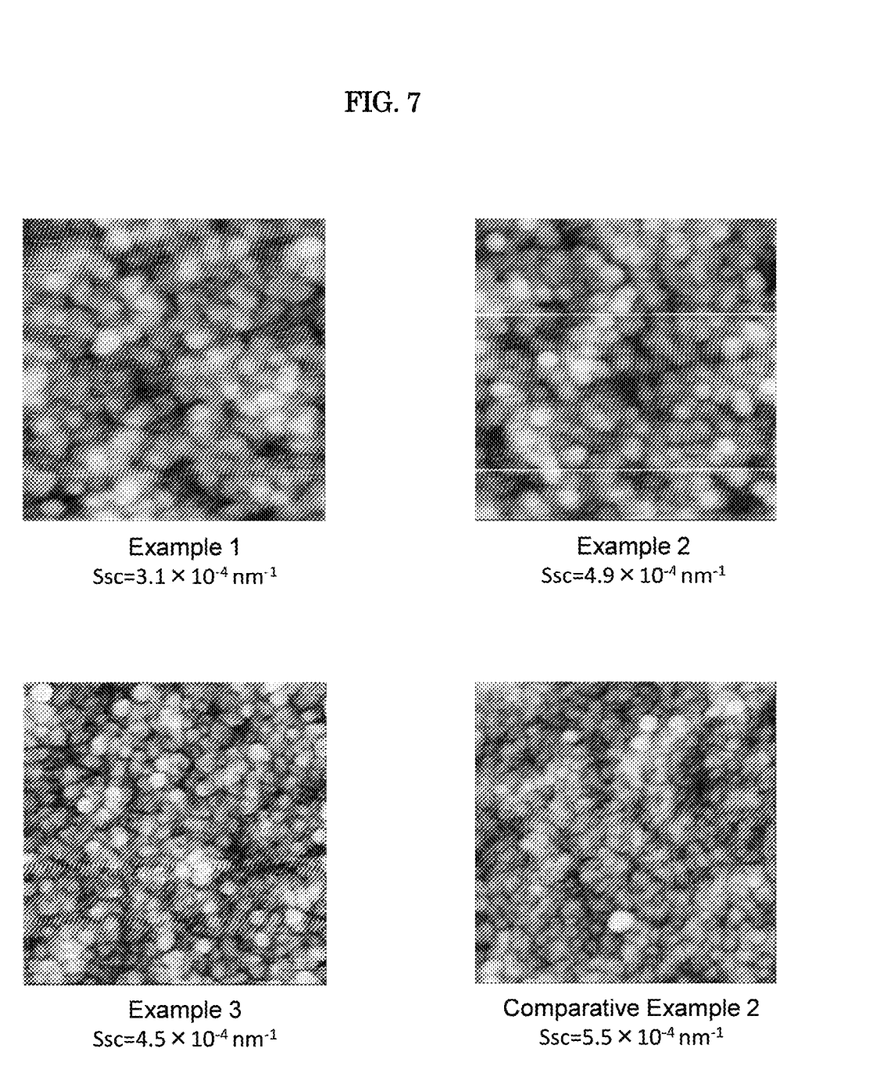
FIG. 7 is scanning probe microscope observation images of surface of transparent electrodes.

Conditions for formation and surface treatment of the transparent electrode layer, and evaluation results in the Examples and Comparative Examples are shown in Table 1. Observation images (observation range: 1 μm×1 μm) of the surfaces of the transparent electrodes in Examples 1 to 3 and Comparative Example 2 with a scanning probe microscope are shown in FIG. 7.

vicinity of the peaks of projections are changed, resulting in improvement of adhesion with the lead-out wiring line.

In Examples 1 to 4 and Comparative Example 1 which employed identical conditions for formation of the transparent electrode layer (crystallization rate controlling layer and principal electrode layer), there was no evident difference in sheet resistance after annealing. The above results show that by performing a sputtering treatment at a low discharge power after formation of the transparent electrode layer, a substrate with a transparent electrode, which has excellent adhesion with a lead-out wiring line while retaining conductivity of the transparent electrode layer, is obtained.

DESCRIPTION OF REFERENCE CHARACTERS 12 transparent (film) substrate
13 transparent electrode (layer)

TABLE 1

| | | | Example 1 | Example 2 | Example 3 | Example 4 | Comparative Example 1 | Comparative Example 2 | Comparative Example 3 | Comparative Example 4 |
|---|---|---|---|---|---|---|---|---|---|---|
| crystallization rate controlling layer | discharge power | kW | | | | | 6.8 | | | — |
| | thickness | nm | | | | | 2.4 | | | |
| | $k_1'$ | nm/kW · sec | | | | | 0.035 | | | |
| principal electrode layer | discharge power | kW | | | | 18.5 | | | 11.1 | 18.5 |
| | thickness | nm | | | | 19.7 | | | 19.7 | 23.0 |
| | $k_1$ | nm/kW · sec | | | | | 0.035 | | | |
| surface treatment | discharge power | kW | 0.5 | 1.0 | 2.0 | 0.4 | 3.5 | — | — | — |
| | thickness change | nm | −0.16 | 0.28 | 0.34 | −0.22 | 1.07 | | | |
| | $k_2$ | nm/kW · sec | −0.032 | 0.028 | 0.017 | −0.055 | 0.031 | | | |
| $k_2/k_1$ | | | −0.89 | 0.79 | 0.48 | −1.55 | 0.86 | — | — | — |
| total thickness | | nm | 21.9 | 22.4 | 22.4 | 21.9 | 23.2 | 22.1 | 22.1 | 23.0 |
| Ssc | | $\times 10^{-4}$ nm$^{-1}$ | 3.1 | 4.9 | 4.5 | 2.9 | 5.6 | 5.5 | 8.3 | 7.2 |
| Sa | | nm | 0.38 | 0.46 | 0.42 | 0.37 | 0.56 | 0.47 | 0.54 | 0.41 |
| peel ratio | | % | 3.4 | 6.0 | 3.6 | 3.1 | 10.9 | 14.3 | 21.4 | 14.6 |
| sheet resistance after annealing. | | Ω/sq | 132 | 129 | 128 | 131 | 127 | 133 | 126 | 130 |
| contact angle | | ° | 60.1 | 67.0 | 63.7 | 61.9 | 68.8 | 61.1 | 72.1 | 63.8 |

The transparent electrode layer in Comparative Example 2 where a surface treatment was not performed after formation of the transparent electrode layer had an average maximum curvature Ssc of $5.5 \times 10^{-4}$ nm$^{-1}$. In contrast, the average maximum curvature Ssc was small and accordingly the peel ratio of the extraction electrode decreased in Examples 1 to 4 where a surface treatment was performed by sputtering at such a discharge power that the ratio $k_2/k_1$ was 0.85 or less. In Comparative Example 1 where a surface treatment was performed by sputtering under the condition of a ratio $k_2/k_1$ of 0.86, the average maximum curvature Ssc was comparable to that in Comparative Example 2, and the peel ratio was not markedly reduced. In Comparative Examples 3 and 4 where conditions for formation of the transparent electrode layer, the average maximum curvature Ssc was larger than that in Comparative Example 2.

In Examples 1 to 4, as the discharge power during the surface treatment decreased, the ratio $k_2/k_1$ decreased, and accordingly the average maximum curvature Ssc decreased, leading to a reduction in peel ratio (improvement of adhesion). There was no evident correlation between the arithmetic average height Sa and the peel ratio. There was no evident correlation between the water contact angle and the peel ratio. Therefore, improvement of adhesion may have only a small correlation with a change in chemical or electrical properties of the surface. These results suggest that when the surface treatment of the transparent electrode layer was performed by a low discharge power sputtering, the shape of the surface of the transparent electrode layer in the 14 lead-out wiring line
15 functional layer
21 substrate with transparent electrode

The invention claimed is:

1. A substrate with a transparent electrode, comprising:
a transparent substrate; and
a transparent electrode layer comprising a metal oxide on the transparent substrate,
wherein a surface of the transparent electrode layer includes a plurality of protrusions, an average maximum curvature Ssc of the surface of the transparent electrode layer is $5.4 \times 10^{-4}$ nm$^{-1}$ or less, and the average maximum curvature Ssc is calculated from a following equation:

$$Ssc = \frac{-1}{2n} \sum_{i=1}^{n} \left\{ \frac{\delta^2 Z(X_i, Y_i)}{\delta X^2} + \frac{\delta^2 Z(X_i, Y_i)}{\delta Y^2} \right\},$$

where n represents a number of the protrusions, Z represents a height of each protrusion, X and Y represent an X coordinate and a Y coordinate in the surface of the transparent electrode, (X, Y) represents a position of the protrusion in the surface of the transparent electrode, and $(X_i, Y_i)$ represents coordinates of an i-th protrusion.

2. The substrate with the transparent electrode according to claim 1, wherein the average maximum curvature Ssc of the surface of the transparent electrode layer is $2.5 \times 10^{-4}$ $nm^{-1}$ or more and $5.0 \times 10^{-4}$ $nm^{-1}$ or less.

3. The substrate with the transparent electrode according to claim 1, wherein the transparent substrate is a transparent film.

4. The substrate with the transparent electrode according to claim 1, further comprising a metallic extraction electrode on the transparent electrode layer.

5. A method for producing a substrate with the transparent electrode comprising a transparent electrode layer comprising a metal oxide provided on a transparent substrate, the method comprising:
a transparent electrode deposition step of applying a first discharge power $x_1$ to a first sputtering target to deposit a transparent electrode layer at a deposition rate $y_1$; and
a surface treatment step of applying a second discharge power $x_2$ to a second sputtering target to surface-treat the transparent electrode layer at a deposition rate $y_2$, wherein a ratio $k_1=y_1/x_1$ and a ratio $k_2=y_2/x_2$ satisfy a relationship of $k_2 \leq 0.85 k_1$, where $k_1$ is a ratio between the discharge power and the deposition rate in the transparent electrode deposition step, and $k_2$ is a ratio between the discharge power and the deposition rate in the surface treatment step.

6. A method for producing the substrate with the transparent electrode according to claim 1, the method comprising:
a transparent electrode deposition step of applying a first discharge power $x_1$ to a first sputtering target to deposit a transparent electrode layer at a deposition rate $y_1$; and
a surface treatment step of applying a second discharge power $x_2$ to a second sputtering target to surface-treat the transparent electrode layer at a deposition rate $y_2$, wherein a ratio $k_1=y_1/x_1$ and a ratio $k_2=y_2/x_2$ satisfy a relationship of $k_2 \leq 0.85 k_1$, where $k_1$ is a ratio between the discharge power and the deposition rate in the transparent electrode deposition step, and $k_2$ is a ratio between the discharge power and the deposition rate in the surface treatment step.

7. The method according to claim 5, wherein $k_2 \leq 0.8 k_1$ is satisfied.

8. The method according to claim 5, wherein the surface treatment step further comprises forming a plurality of protrusions on a surface of the transparent electrode layer, an average maximum curvature $Ssc_0$ of the surface of the transparent electrode layer after the transparent electrode deposition step and before the surface treatment step is $5.5 \times 10^{-4}$ $nm^{-1}$ or more, and the average maximum curvature Ssc is calculated from a following equation:

$$Ssc = \frac{-1}{2n} \sum_{i=1}^{n} \left\{ \frac{\delta^2 Z(X_i, Y_i)}{\delta X^2} + \frac{\delta^2 Z(X_i, Y_i)}{\delta Y^2} \right\},$$

where n represents a number of the protrusion, Z represents a height of each protrusion, X and Y represent an X coordinate and a Y coordinate in the surface of the transparent electrode, (X, Y) represents a position of the protrusion in the surface of the transparent electrode, and $(X_i, Y_i)$ represents coordinates of an i-th protrusion, and
$Ssc_0$ is an average maximum curvature of the surface of the transparent electrode layer after the transparent electrode deposition step and before the surface treatment step.

9. The method according to claim 5, wherein
a difference $Ssc_0 - Ssc_1$ is $5 \times 10^{-5}$ $nm^{-1}$ or more, where
an average maximum curvature Ssc is calculated from a following equation:

$$Ssc = \frac{-1}{2n} \sum_{i=1}^{n} \left\{ \frac{\delta^2 Z(X_i, Y_i)}{\delta X^2} + \frac{\delta^2 Z(X_i, Y_i)}{\delta Y^2} \right\},$$

where n represents a number of the protrusions, Z represents a height of each protrusion, X and Y represent an X coordinate and a Y coordinate in the surface of the transparent electrode, X, Y) represents a position of the protrusion in the surface of the transparent electrode, and $(X_i, Y_i)$ represents coordinates of an i-th protrusion,
$Ssc_0$ is an average maximum curvature of the surface of the transparent electrode layer after the transparent electrode deposition step and before the surface treatment step, and
$Ssc_1$ is an average maximum curvature of the surface of the transparent electrode layer after the surface treatment step.

10. The method according to claim 5, wherein
in each of the transparent electrode deposition step and the surface treatment step, sputtering is performed while an inert gas and oxygen are introduced, and
an oxygen partial pressure in a chamber during the surface treatment step is preferably larger than an oxygen partial pressure in a chamber during the transparent electrode deposition step.

11. The method according to claim 5, wherein
the first sputtering target used in the surface treatment step has a composition identical to a composition of the second sputtering target used in the transparent electrode deposition step.

12. The method according to claim 5, further comprising
a heating step after the surface treatment step, to crystallize the transparent electrode layer.

13. The method according to claim 5, further comprising
an extraction electrode forming step to form a metallic extraction electrode on the transparent electrode layer after the surface treatment step.

14. The substrate with the transparent electrode according to claim 1, wherein the metal oxide includes one or more of indium oxide, zinc oxide or tin oxide.

15. The substrate with the transparent electrode according to claim 14, wherein indium oxide includes indium tin oxide (ITO).

16. The substrate with the transparent electrode according to claim 3, wherein the thickness of the transparent film is 0.01 mm or more and 0.4 mm or less.

17. The substrate with the transparent electrode according to claim 1, wherein the transparent electrode layer is formed one or both of surfaces of the transparent substrate.

18. The method according to claim 5, wherein a discharge voltage during the surface treatment step is 400 V or less.

19. The substrate with the transparent electrode according to claim 1, further comprising one or more of a functional layer between the transparent substrate and the transparent electrode layer.

20. The substrate with the transparent electrode according to claim 19, wherein the functional layer includes any of an optical optimizing layer, an anti-reflection layer, an anti-glare layer, an easily adhesive layer, a stress buffer layer, a hard coat layer, a slippery layer, an antistatic layer, a crystallization acceleration layer, a crystallization rate controlling layer, and a durability improvement layer.

* * * * *